United States Patent
Wang et al.

(10) Patent No.: US 7,303,984 B2
(45) Date of Patent: Dec. 4, 2007

(54) SEMICONDUCTOR SUBSTRATE STRUCTURE AND PROCESSING METHOD THEREOF

(75) Inventors: Bily Wang, Hsin Chu (TW); Jonnie Chuang, Pan Chiao (TW); Hui-Yen Huang, Hsin Chu (TW)

(73) Assignee: Harvatek Corporation, Hsin Chu (TW)

( * ) Notice: Subject to any disclaimer, the term of this patent is extended or adjusted under 35 U.S.C. 154(b) by 281 days.

(21) Appl. No.: 11/081,527

(22) Filed: Mar. 17, 2005

(65) Prior Publication Data

US 2006/0035407 A1 Feb. 16, 2006

Related U.S. Application Data

(62) Division of application No. 10/918,371, filed on Aug. 16, 2004, now abandoned.

(51) Int. Cl.
*H01L 21/4763* (2006.01)

(52) U.S. Cl. .............................. 438/618; 257/E21.705

(58) Field of Classification Search ............... 438/197, 438/199, 213, 220, 223–224, 227–228, 275–276, 438/279, 289–291, 308, 473–474, 476, 480, 438/531–515, 517, 526–527, 529–531, 542, 438/546–549, 551–553, 563, 567, 761–762, 438/765–766, 769–772, 774–778, 782–784, 438/786–788

See application file for complete search history.

(56) References Cited

U.S. PATENT DOCUMENTS

| | | | |
|---|---|---|---|
| 7,094,661 B2 * | 8/2006 | Lee et al. | 438/400 |
| 2003/0060034 A1 * | 3/2003 | Beyne et al. | 438/618 |
| 2005/0067688 A1 * | 3/2005 | Humpston | 257/704 |

* cited by examiner

*Primary Examiner*—Michael Lebentritt
*Assistant Examiner*—Andre' Stevenson
(74) *Attorney, Agent, or Firm*—Rosenberg, Klein & Lee

(57) ABSTRACT

A semiconductor substrate structure includes a substrate having a trench formed thereon, a polymer composite material supplied into the trench and an electroplate conductive layer formed on the substrate. Further, a semiconductor substrate processing method includes the steps of: providing a substrate forming a trench thereon, supplying a polymer composite material into the trench, polishing a surface of the substrate and forming a covering material on the surface of the substrate. Therefore, the method is provided for combining the polymer composite material into the substrate, thereby to raise cutting precision and strength of the semiconductor substrate structure.

5 Claims, 4 Drawing Sheets

SEMICONDUCTOR SUBSTRATE STRUCTURE AND PROCESSING METHOD THEREOF

This application is a Divisional patent application of application Ser. No. 10/918,371 filed on 16 Aug. 2004, now abandoned.

BACKGROUND OF THE INVENTION

1. Field of the Invention

The present invention relates to a semiconductor substrate structure and processing method thereof, and more particularly, relates to a method for combining a polymer composite material into a substrate, thereby to raise cutting precision and strength of the semiconductor substrate structure.

2. Description of the Related Art

In the electronic industry, the electronic packaging industry will gradually get important due to electronic products which are required in light, thin, short, small and high function besides the semiconductor industry. The packaging technique in the electronic packaging industry will find new ways of doing things from old theories, such as a ball gate array package, a plastic pingrid array package, TQFP, TSOP, etc.

In a conventional electronic packaging technique, a semiconductor integrated circuit is manufactured and then assembled with other electronic elements to become an electronic product for achieving a specific design function. The electronic packaging technique provides four main functions, which respectively are power distribution, signal distribution, heat dissipation, and protection and support, applying to IC chap packaging and LED packaging.

The electronic packaging technique can be divided into different levels, as follows. A first level packaging (or chip level packaging) is provided for combining the IC chip with the packaging structure to form an electronic module. In plastic dual-in-line package (PDIP), the first level packaging includes die attach, wire bond and encapsulation. A second level packaging is provided for assembling the electronic module on the circuit board to form a circuit card or a printed circuit board. In the second level packaging, it is noticed to manufacture of the circuit board and connection technique between the electronic elements and the circuit board, such as a pin through hole (PTH) and a surface mount technology (SMT). A third and fourth level packages are provided for combination of the circuit board and the circuit card to form sub-system and system.

Referring to FIG. 1, a conventional metal substrate 1a will be cut by a cutter 12a. When cutting, the conventional metal substrate 1a will have some cutting questions due to the structure strength and the cutting precision, thereby to easily produce cutting bur and structure deformation. Further, it will affect the cutting speed and precision, thereby to increase defective fraction of the packaging product.

The present invention has been conceived to solve the problem in the background art, and the object of the present invention is to provide a method for combining the substrate with the polymer composite material, thereby to raise cutting precision and strength of the semiconductor substrate structure.

SUMMARY OF THE INVENTION

It is therefore a principal object of the present invention to provide a semiconductor substrate structure, which can obtain better structure strength so as to easily be cut and keep better cutting precision.

Another object of the present invention is to provide a semiconductor substrate processing method, which can obtain lower cost and high quality of packaging processing.

To achieve the above object, one feature of the present invention is provided for a semiconductor substrate structure including a substrate having a trench formed thereon, a polymer composite material supplied into the trench and an electroplate conductive layer formed on the substrate.

Wherein a height of the polymer composite material projected from an upper surface of the substrate is lower than that of the electroplate conductive layer.

The present invention provides a semiconductor substrate processing method including the steps of: (1) providing a substrate forming a trench thereon; (2) supplying a polymer composite material into the trench; (3) polishing a surface of the substrate; and (4) forming a covering material on the surface of the substrate.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
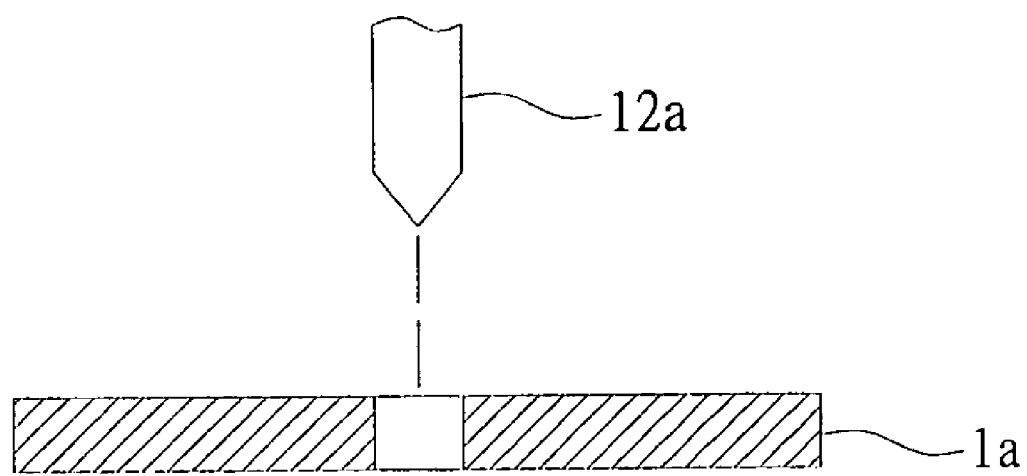
FIG. 1 is a schematic view of a conventional substrate structure in a cutting condition.
Figure 2A:
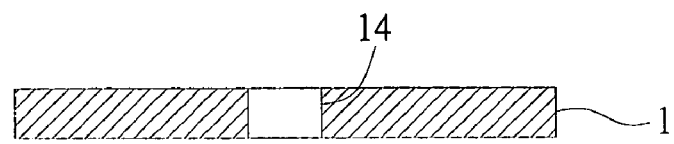
FIGS. 2A-2D are cross-sectional views illustrating a sequence of steps for a semiconductor substrate processing method in accordance with a first embodiment of the present invention.
Figure 2B:
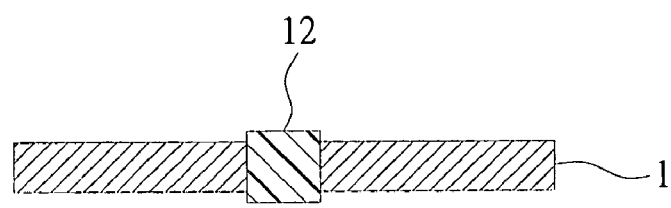
Figure 2C:
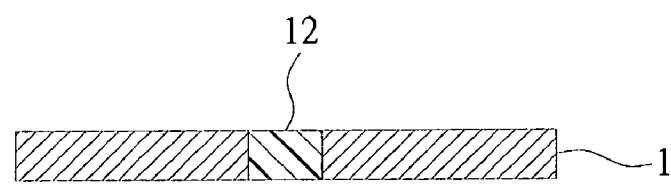
Figure 2D:
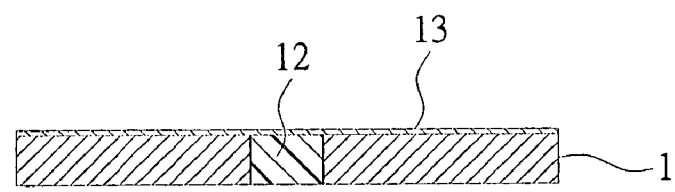

Referring now to the drawings wherein the showings are for purposes of illustrating preferred embodiments of the present invention only, and not for purposes of limiting the same, FIGS. 2A-2D and FIGS. 3A-3C are cross-sectional views each illustrating a sequence of steps for substrate processing method in accordance with two embodiments of the present invention.

Please refer to FIGS. 2A-2D, a semiconductor substrate processing method includes the steps of: (1) providing a substrate 1 forming a trench 14 thereon by means of a chemical etching process; (2) roughing a surface of the substrate by means of a chemical process or a sand-blasting manner for effectively combining polymer composite materials; (3) supplying a polymer composite material 12 (such as a polyethylene material, PE) into the trench 14 by means of a screen printing manner or a steel plate printing manner; (4) polishing or sand-blasting the surface of the substrate for polishing the polymer composite material 12 spilled on the surface of the substrate; and (5) forming a covering material 13 on the surface of the substrate by means of a surface electroplating process.

Figure 3A:
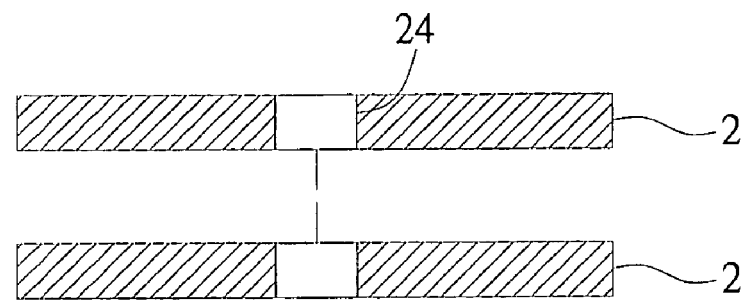
FIGS. 3A-3C are cross-sectional views illustrating a sequence of steps for a substrate processing method in accordance with a second embodiment of the present invention.
Figure 3B:
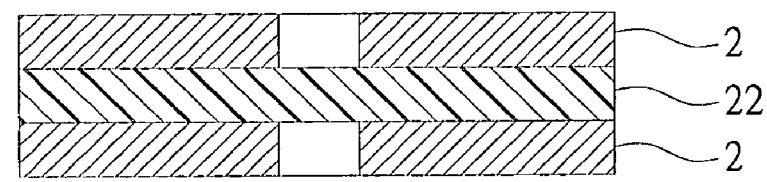
Figure 3C:
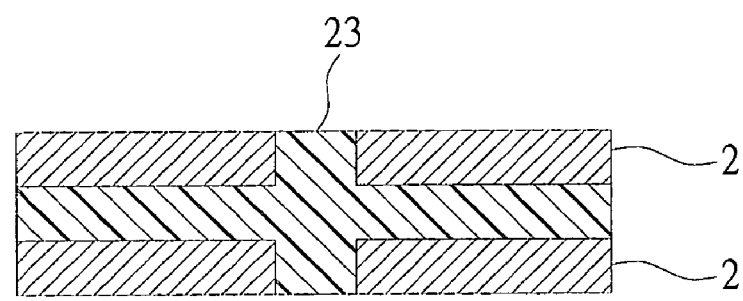

Please refer to FIGS. 3A-3C, a substrate processing method for a semiconductor includes the steps of: (1) providing two substrates 2 each forming a trench 24 thereon by means of a chemical etching process; (2) roughing a surface of the substrate 2 by means of a chemical process or a sand-blasting manner for effectively combining polymer composite materials on the surface of the substrate 2; (3) placing a polymer thin plate 22 (such as a polypropylene material, PP) between the two substrates 2; (4) supplying a polymer composite material 23 melted into the trench 24 in a high temperature and pressure condition; and (5) polishing or sand-blasting the surface of the substrate for polishing the polymer composite material 12; thereby to obtain the better substrate structure strength.

The present invention provides a semiconductor substrate structure including a substrate 1 having a trench 14 formed thereon, a polymer composite material 12 supplied into the trench 14 and an electroplate conductive layer 13 formed on the substrate 1 (see FIGS. 2A-2D). Further, a height of the polymer composite material 12 projected from the surface of the substrate is lower than that of the electroplate conductive layer 13.

In addition, the present invention provides a semiconductor substrate structure including two substrate 2 (first and second substrates) each having a trench 24 formed thereon, a polymer thin plate 22 placed between the first substrate and the second substrate, and a polymer composite material 23 supplied into the trench 24 (see FIGS. 3A-3C). The polymer thin plate 22 is made of a polypropylene material.

Figure 4:
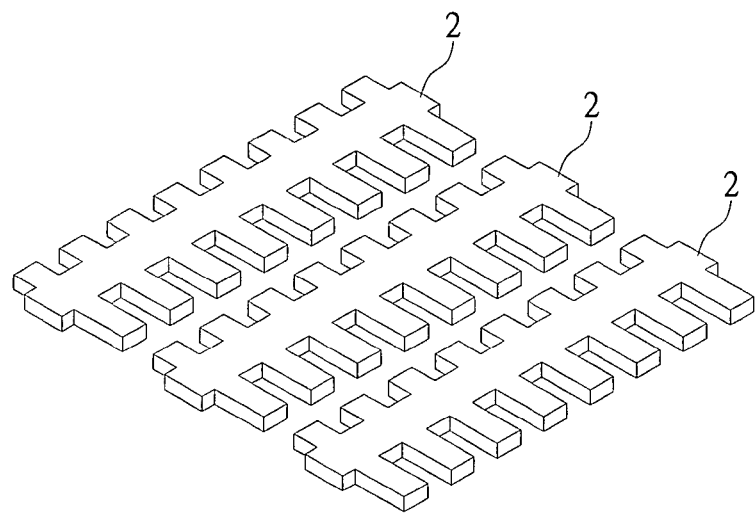
FIG. 4 is a perspective view of a substrate after etching process.
Figure 5:
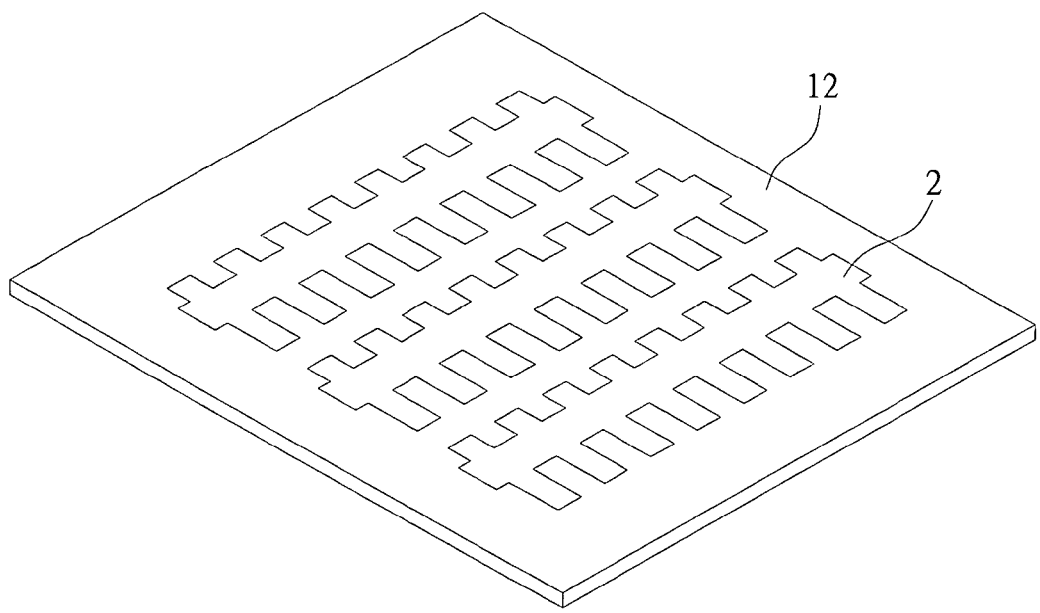
FIG. 5 is a perspective view of the substrate combined with the polymer composite material.

FIG. 4 shows a perspective view of three substrates after a chemical etching process. FIG. 5 shows a perspective view of a semiconductor substrate structure in accordance with first embodiment of the present invention after the polymer composite material 12 supplied into the trench 14.

The present invention has a main feature in that: the substrate and the polymer material are combined together, thereby to improve the material property of the substrate, provide lower equipment cost and not affect chip packaging process.

The mechanical equipments for applying the polymer composite material supplied into the trench of the substrate or polishing the surface of the substrate will not need the high cost, thereby easy to obtain or install. The semiconductor substrate structure of the present invention is a strong structure and to be cut easily. Further, the process method of the present invention will not affect the original packaging process, and it can be operated into the original packaging process due to the unchanged packaging machine to achieve the present requirement.

The present invention has following advantages: (1) to easily arrange new manufacturing process, so that the requirement of price and technique of new equipment is not high; (2) the mechanical strength of the substrate is better; (3) to be cut easily; and (4) the original packaging machine still can be used in the original packaging process. While the preferred embodiment in accordance with the present invention has been shown and described, and the alternative embodiment has been described, equivalent modifications and changes known to persons skilled in the art according to the spirit of the present invention are considered to be within the scope of the present invention as defined in the appended claims.

What is claimed is:

1. A semiconductor substrate processing method comprising the steps of:

providing two substrates each having a trench formed therethrough by means of a chemical etching process, the trenches of the substrates being aligned one with the other;

roughing a surface of the substrate by means of a chemical process or a sand-blasting manner for effectively combining the polymer composite material on the surface of the substrate;

placing a polymer thin plate between the two substrates;

supplying a polymer composite material melted into the trench in a high temperature and pressure condition;

polishing or sand-blasting the surface of the substrate for polishing the polymer composite material.

2. The method as recited in claim 1, wherein the substrates are symmetrically disposed about the polymer thin plate.

3. The method as recited in claim 1, wherein the polymer thin plate is formed of a polypropylene material.

4. The method as recited in claim 1, wherein the polymer composite material is formed of a polyethylene material.

5. The method as recited in claim 1, wherein the polymer thin plate is sandwiched between the substrates aligned in outer peripheral contour therewith.

* * * * *